US005838725A

United States Patent [19]

Gurusami et al.

[11] Patent Number: 5,838,725

[45] Date of Patent: Nov. 17, 1998

[54] FLOATING POINT DIGITAL TRANSVERSAL FILTER

[75] Inventors: Aravanan Gurusami, East Syracuse; Michael Nekhamkin, DeWitt; Robert J. Chamberlin, Jamesville, all of N.Y.

[73] Assignee: U.S. Philips Corporation, New York, N.Y.

[21] Appl. No.: 759,669

[22] Filed: Dec. 6, 1996

[51] Int. Cl.[6] .......... H03H 7/30

[52] U.S. Cl. .......... 375/229; 375/350; 364/724.1; 364/724.2; 364/724.16

[58] Field of Search .......... 375/229, 350; 364/724.1, 724.2, 724.16

[56] References Cited

U.S. PATENT DOCUMENTS

| | | | |
|---|---|---|---|
| 5,311,459 | 5/1994 | D'Luna et al. | 364/724.16 |
| 5,477,479 | 12/1995 | Ochi | 364/724.16 |
| 5,563,816 | 10/1996 | Golla et al. | 364/724.16 |

*Primary Examiner*—Stephen Chin
*Assistant Examiner*—Tuan Le
*Attorney, Agent, or Firm*—Edward W. Goodman

[57] ABSTRACT

A digital finite impulse response (FIR) filter having a shift register for receiving a digital signal, a counter for counting pulses in a sampling signal and a look-up table read-only memory (ROM) having address inputs coupled to the outputs of the stages of the FIR filter and to the outputs from the counter. The output of the ROM forms the filtered signal. This digital filter approach allows for a balance between cost and performance and is inherently flexible due to the programmable nature of its core device (ROM).

2 Claims, 4 Drawing Sheets

FLOATING POINT DIGITAL TRANSVERSAL FILTER

BACKGROUND OF THE INVENTION

1. Field Of The Invention

The subject invention relates to a baseband data filter which is commonly used in transmission systems to accomplish band limiting of the baseband input of the modulator which serves to limit the spectrum of the modulated signal. The filter's response must be precisely defined, in regard to the symbol rate, in order to minimize inter-symbol interference and edge jitter due to signal distortion.

An ongoing challenge in the design of bandwidth efficient digital communication systems is the pursuit of means to limit the bandwidth of the transmitted signal without introducing excessive distortions in the recovered signal. The distortions introduced by the transmission system adversely affect the integrity of the recovered data.

2. Description Of The Related Art

Classical approaches to the design of digital finite impulse response (FIR) filters, used for band-limiting, have yielded filters that are composed of many elements and are consequently large and/or expensive. A typical structure of a digital FIR filter is shown in FIG. 1. Input binary data is shifted into a shift register 10 with the sampling rate fs. The outputs from the individual stages of the shift register 10 are multiplied by respective coefficients h(1)–h(N) in multipliers 12.1–12.N. The outputs from the multipliers 12.1–12.N are added together in adder 14 which then forms the filtered output signal. At any sampling interval, the output of the filter is represented as:

$$y_j = \sum_{i=1}^{N} d_i * h_i \quad (1)$$

where $d_i$ is an input data bit, $h_i$ is a filter coefficient, N is a number of taps (filter length), and j is a sampling interval number.

A direct look-up table implementation of this filter would require a table size equal to $2^N$ words so that a 64K table might implement only a 16-tap filter.

SUMMARY OF THE INVENTION

It is an object of the present invention to provide a relatively inexpensive small digital FIR filter that achieves the performance of larger expensive digital FIR filters.

It is a further object of the invention to provide a digital FIR filter having a relatively small look-up memory.

These objects are achieved in a digital FIR filter comprising a data input for receiving a data signal to be filtered, said data signal having a bit rate of fb; a shift register coupled to said data input for receiving said data signal, said shift register having (N/k)-1 stages, where N is a number of taps and k is an interpolation factor, each of said (N/k)-1 stages having an output; an input for receiving a sampling signal fs, where k=fs/fb; a modulo-K counter having an input for receiving the sampling signal fs and an output for supplying an output signal having ceil ($\log_2 k$) bits, where ceil ($\log_2 k$) is the least integer greater than or equal to $\log_2 k$; and a memory having address input means coupled to the data input of the digital FIR filter and to the outputs of said (N/k)-1 shift register stages forming a first N/k address bits, and to the output of said modulo-K counter forming ceil ($\log_2 k$) most significant address bits, and an output for supplying a filter output signal M, said memory having stored therein different filter output values, said output values being determined by the formula:

$$M = 2^{int(N/k)}((N \bmod k)+k).$$

Applicants have realized that the size of the look-up table can be reduced if the filter works as an interpolating filter which is always the case if this filter is used in the transmitter as a shaping filter. In this mode, the filter receives the NRZ data with the bit rate fb and outputs them with the sampling rate. For every input bit, the filter outputs k=fs/fb words, where k is an interpolation factor. The operation of this filter can be explained with reference to FIG. 2. The filter has a stage 20 at its input which inserts k-1 zeroes between the data bits. The output of this stage 20 has three levels, i.e., +1, −1, 0, following with the sample rate. At any moment, the shift register 22 contains only ceil (N/k) data bits, where ceil (x) is the least integer greater than or equal to x. Zeroes do not contribute to the filter output. In each bit period, there are k sampling periods. As in FIG. 1, the outputs from the individual stages in the shift register 22 are multiplied by respective coefficients h(1)–h(N) in multipliers 24.1–24.N, and the outputs therefrom are added in adder 26. During period #1, the filter output is $y_1=d_1*h_1+d_2*h_{k+1}+d_3*h_{2k+1}+ \ldots$ During period #2, the filter output is $y_2=d_1*h_2+d_2*h_{k+2}+d_3*h_{2k+2}+ \ldots$, and so on. Therefore, in each bit period, each data bit, except the most significant bit (MSB), is multiplied consecutively by k adjacent coefficients. The MSB is multiplied by (N mod k) filter coefficients. Since zeroes do not contribute to the filter output, they do not need to be stored and multiplied. Therefore, the circuit shown in FIG. 3 may be used instead of that shown in FIG. 2.

The shift register 30 stores only data bits which are shifted into the register with the bit rate. The outputs from the individual stages of the shift register 30 are applied to inputs of multipliers 32.1–32.ceil(N/k) which receive, consecutively, coefficients h(1)–h(k) to h(N-k) to h(N). The outputs from the multipliers are added together in adder 34 which forms the output signal. Each multiplier operates at the sampling rate. For instance, the multiplier in the tap #1 performs consecutive multiplication of the data bit by coefficients $h_1, h_2, \ldots, h_k$ during the bit interval.

Now, the total number M of different filter output values for a given filter length and over-sampling factor may be calculated. This number defines the size of the look-up table. If N/k is an integer:

$$M = 2^{N/k} \times k \quad (2)$$

BRIEF DESCRIPTION OF THE DRAWINGS

With the above and additional objects and advantages in mind as will hereinafter appear, the invention will be described with reference to the accompanying drawings, in which.

DESCRIPTION OF THE PREFERRED EMBODIMENTS

Figure 1:
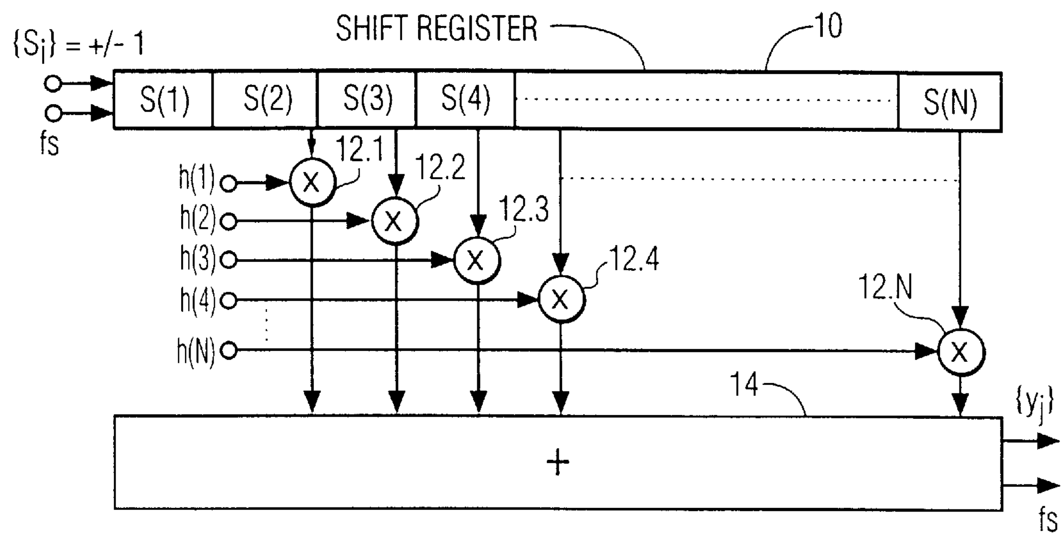
FIG. 1 shows a block diagram of a typical digital FIR filter.
Figure 2:
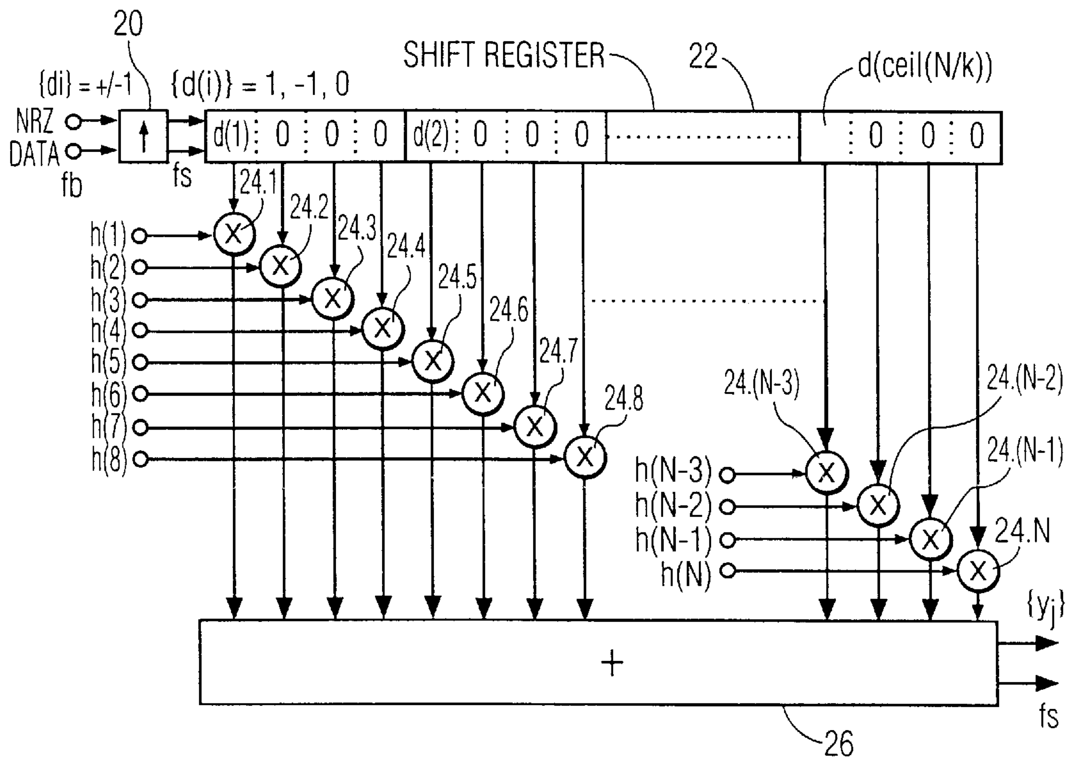
FIG. 2 shows a block diagram of a typical interpolating digital FIR filter.
Figure 3:
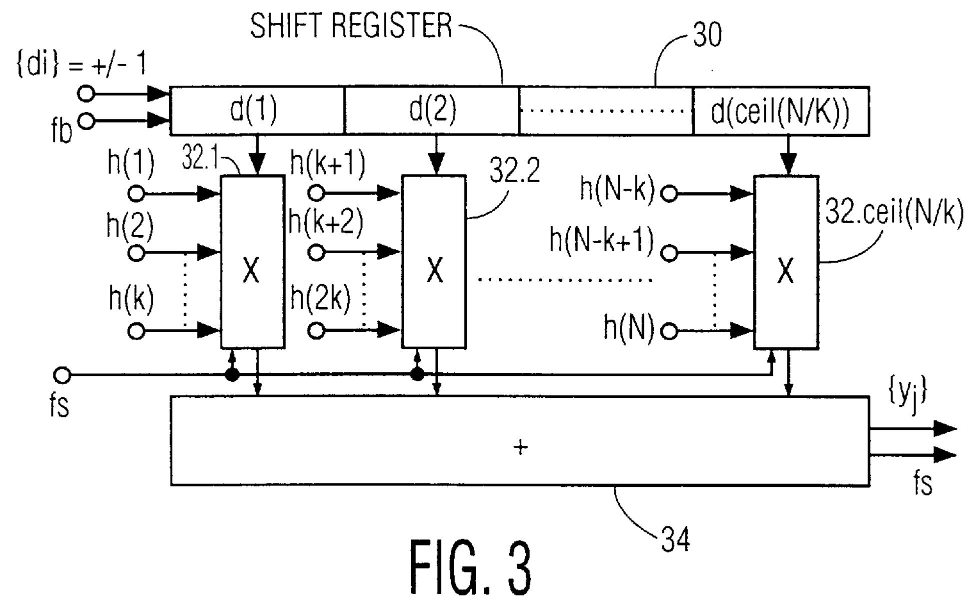
FIG. 3 shows a block diagram of the filter of FIG. 2 where each data bit is multiplied consecutively by k adjacent coefficients.
Figure 4:
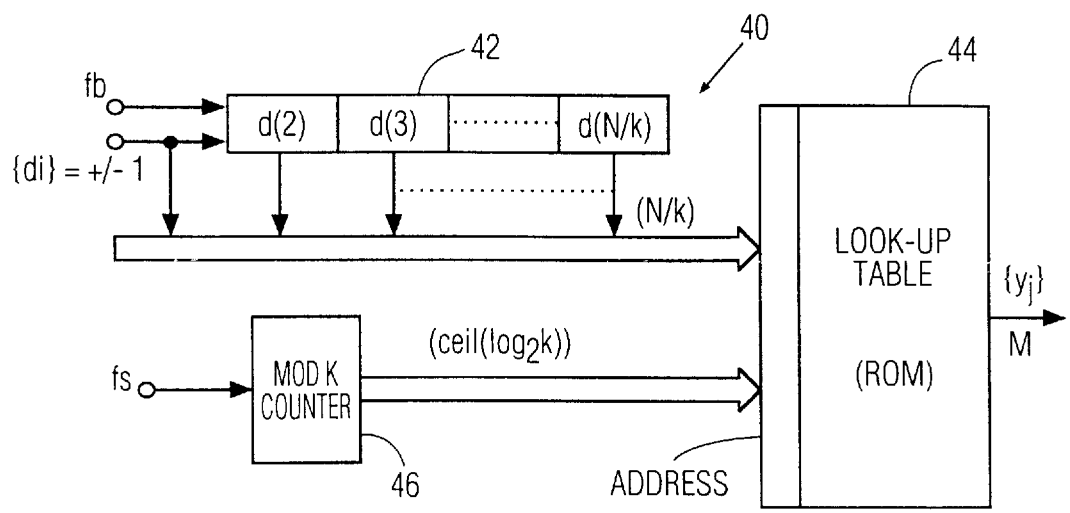
FIG. 4 shows a block diagram of a first embodiment of a digital FIR filter in accordance with the present invention, using a look-up table.

FIG. 4 shows a block diagram of a first embodiment of a digital FIR filter 40 in accordance with the present invention, using a look-up table. The digital FIR filter 40 includes a shift register 42 to which the data signal d(i) is applied. The shift register 42 receives a shift signal having the bit rate fb. The length of the shift register is (N/k)-1 since the first bit d(1) does not need to be stored. The input to the shift register 42 and the outputs from each of the stages form first N/k address bits which are applied to a look-up table ROM 44.

The sampling signal fs is applied to a modulo-k counter 46. This counter 46 runs at the sampling rate and counts up to k. The counter output forms ceil($\log_2 k$) most significant address bits for the look-up table ROM 44. If, for example, N=56 (i.e., a digital FIR filter with 56 taps) and k=4, applying equation (2), the size of ROM 44 would be 64K words.

Since the calculation of the filter output values may be done using floating point arithmetic, this filter is a floating point filter. The truncation occurs only at the filter output and the output precision is defined by the word size of the ROM 44.

If N/k is rational:

$$M=2^{ceiL(N/k)}(N \bmod k)+2^{int(N/k)}(k-(N \bmod k)) \quad (3)$$

This may be reduced to:

$$M=2^{int(N/k)}((N \bmod k)+k) \quad (4)$$

It should be noted that equation (2) may be derived from equation (4) by substituting (N mod k)=0 since N/k is an integer.

Figure 5:
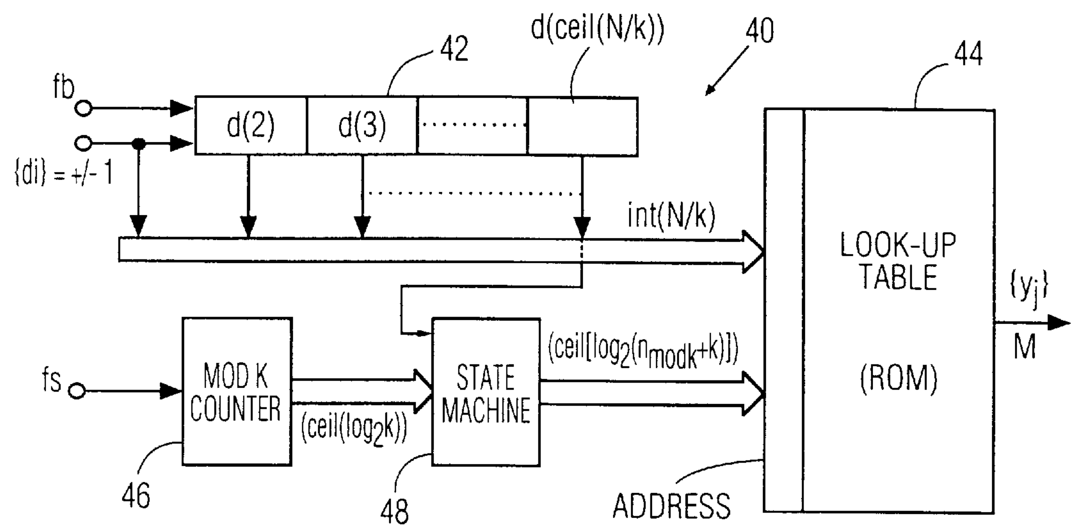
FIG. 5 shows a block diagram of a second embodiment of the digital FIR filter of the subject invention.

The embodiment shown in FIG. 5 is substantially similar to that shown in FIG. 4, with the exception that a state machine is used. The output from the counter 46 and the most significant bit (MSB) d(ceil(N/k)) from the shift register 42 are connected to a state machine 48. As stated above, if N/k is not an integer, the MSB contributes to the filter output only during first (N mod k) sampling periods of the bit interval. The state machine 48 substitutes some of the counter 46 states by the new states based on the value of d(ceil(N/k)). In other words, the state machine 48 maps the MSB and the counter 46 outputs to the address lines of the ROM 44.

For example, if N=65 and k=5, then $M=5*2^{13}$ that takes up a 64K ROM. If N=68 and k=5, then $M=8*2^{13}$=64K, i.e., this filter still fits in a 64K ROM. For k=5, the counter 46 has 3 outputs which can represent up to 8 different states. Since the counter 46 counts only up to 5, 3 states are not used. These states may be used to represent the MSB contribution to the filter output during (68 mod 5)=3 sampling intervals.

Figure 6:
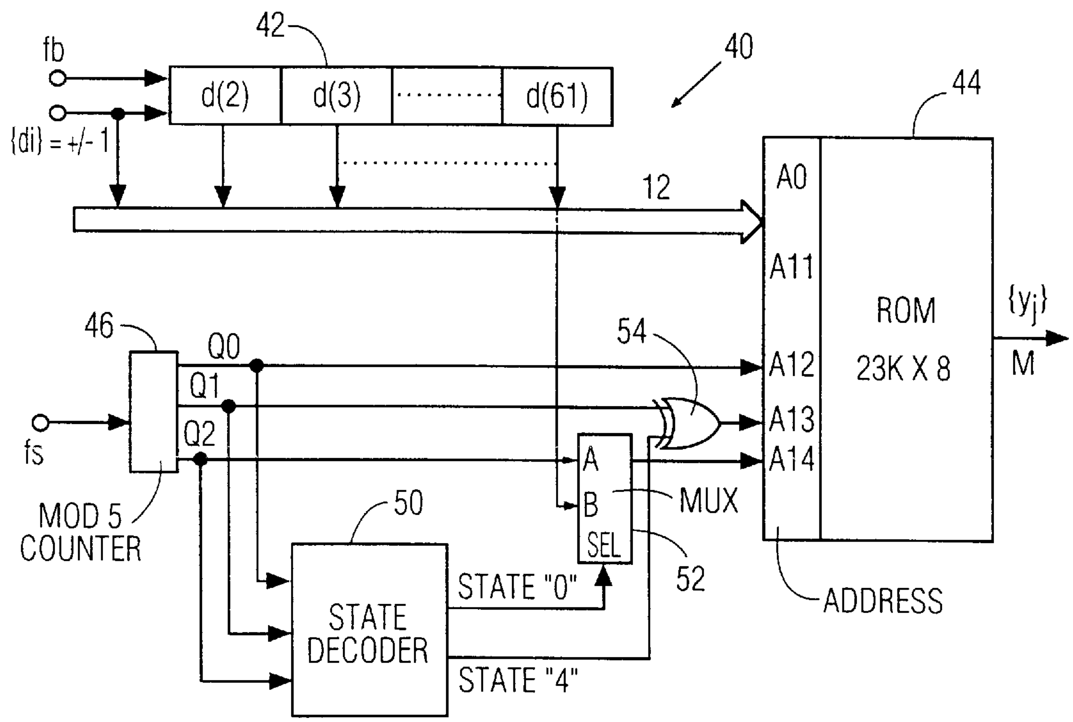
FIG. 6 shows a block diagram of a third embodiment of the digital FIR filter of the subject invention.

FIG. 6 shows an example of a state machine implementation for N=61 and k=5. The outputs from the counter 46 are connected to inputs of a state decoder 50. A first output Q0 from the counter 46 is connected directly to the address input of the ROM 44, and the third output Q2 from the counter 46 is connected to a first input of a multiplexer 52, the second input of which is connected to the output from the last stage of the shift register 42. A select input of the multiplexer 52 is connected to a first output from the state decoder 50, and an output from the multiplexer 52 is connected to the address input of the ROM 44. The second output Q1 from the counter 46 along with a second output from the state decoder 50 are connected to inputs of an exclusive-OR-gate 54, the output therefrom being connected to the address input of the ROM 44. Bit d(61) contributes to the filter output only in the first sampling period of every bit interval. Multiplexer 52 selects this bit only in this sampling period which corresponds to the state 0 of the counter 46. During the remaining 4 sampling intervals, only the counter 46 outputs affect the address generation. In state 4, the counter 46 outputs the pattern 100 which coincides with one of the address patterns in state 0. Therefore, it should be replaced by one of the unused patterns, for instance 110. This can be done with the exclusive-OR-gate 54.

Table 1 shows a truth table for the embodiment of FIG. 6.

TABLE 1

| SAMPLING INTERVAL # (COUNTER STATE) | d(61) | O2 | O1 | O0 | A14 | A13 | A12 |
|---|---|---|---|---|---|---|---|
| 0 | 0 | 0 | 0 | 0 | 0 | 0 | 0 |
| | 1 | 0 | 0 | 0 | 1 | 0 | 0 |
| 1 | X | 0 | 0 | 1 | 0 | 0 | 1 |
| 2 | X | 0 | 1 | 0 | 0 | 1 | 0 |
| 3 | X | 0 | 1 | 1 | 0 | 1 | 1 |
| 4 | X | 1 | 0 | 0 | 1 | 1 | 0 |

Figure 7:
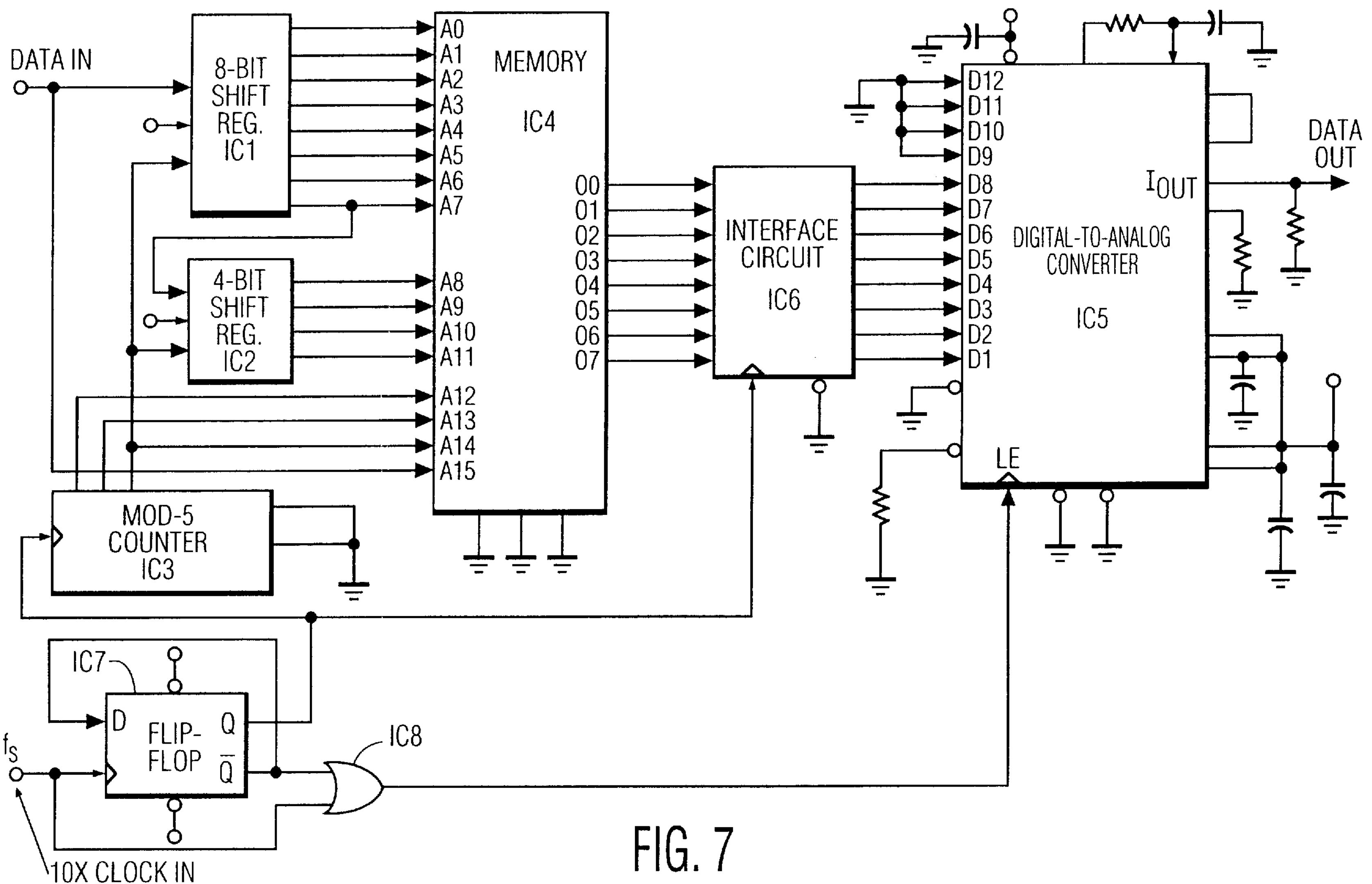
FIG. 7 shows a practical implementation of a full transversal filter using the FIR filter of FIG. 4, and a digital-to-analog converter.

FIG. 7 shows a practical implementation of a full transversal filter using the FIR filter of FIG. 4. In particular, the data is applied to an input of an 8-bit register IC1. The eighth bit output from IC1 is applied as an input to a 4-bit register IC2. The sampling frequency fs is applied to the clock input of a D-flip-flop IC7 in toggle mode, and the Q output therefrom is applied to the count input of a modulo-5 counter IC3. The third counting output from counter IC3 is applied as a shift signal to the registers IC1 and IC2.

A read-only memory (ROM) IC4 includes 16 address inputs A0–A15. The 8 outputs from register IC1 along with the 4 outputs from register IC2 are applied to the address inputs A0–A11 of ROM IC4. The first, second and third outputs from counter IC3 are applied to address inputs A12–A14 of Rom IC4 and the input data signal is applied to address input A15 of ROM IC4. The 8-bit outputs 00–07 are applied through an interface circuit IC6, which receives a clocking signal from the Q output of D-flip-flop IC7, to data inputs D1–D8 of digital-to-analog (D/A) converter IC5, the data inputs D9–D12 being connected to ground. The $\overline{Q}$ output from the D-flip-flop IC7 is connected to the D input and to one input of an OR-gate IC8, which receives the sampling frequency fs at its other input. The output from the OR-gate IC8 is applied to the latch enable (LE) input of the D/A converter IC5. The analog output signal is then obtained at $I_{OUT}$ of the D/A converter IC5.

Integrated circuits used for IC1–IC8 are as follows:

| | |
|---|---|
| IC1 | 74HC164 |
| IC2 | 74HC164 |
| IC3 | 74HC390 |
| IC4 | 27HC512 |
| IC5 | AD9713 |
| IC6 | 74HC374 |
| IC7 | 74HC74 |
| IC8 | 74HC32 |

Numerous alterations and modifications of the structure herein disclosed will present themselves to those skilled in the art. However, it is to be understood that the above described embodiment is for purposes of illustration only and not to be construed as a limitation of the invention. All such modifications which do not depart from the spirit of the invention are intended to be included within the scope of the appended claims.

What is claimed is:

1. A digital finite impulse response (FIR) filter comprising:

an input for receiving a data signal to be filtered, said data signal having a bit rate of fb;

a shift register coupled to said input for receiving said data signal, said shift register having (N/k)-1 stages, where N is a number of taps and k is an interpolation factor, each of said (N/k)-1 stages having an output;

an input for receiving a sampling signal fs, where k=fs/fb;

a modulo-K counter having an input for receiving the sampling signal fs and an output for supplying an output signal having ceil ($\log_2 k$) bits, where ceil ($\log_2 k$) is the least integer greater than or equal to $\log_2 k$; and a memory having address input means coupled to the input of the digital FIR filter and to the outputs of said (N/k)-1 shift register stages forming a first N/k address bits, and to the output of said modulo-K counter forming ceil ($\log_2 k$) most significant address bits, and an output for supplying a filter output signal M, said memory having stored therein different filter output values, said output values being determined by the formula:

$$M=2^{int(N/k)}((N \bmod k)+k).$$

2. A digital finite impulse response (FIR) filter as claimed in claim 1, wherein said digital FIR filter further comprises a state machine coupled between the output of the modulo-K counter and the address input means of the memory, said state machine having a further input coupled to the output of a last stage of said shift register.

* * * * *